(12) United States Patent  (10) Patent No.: US 8,773,944 B2
Chen et al.  (45) Date of Patent: Jul. 8, 2014

(54) CONCURRENT MULTIPLE-DIMENSION WORD-ADDRESSABLE MEMORY ARCHITECTURE

(75) Inventors: Chihtung Chen, San Diego, CA (US); Inyup Kang, San Diego, CA (US); Viraphol Chaiyakul, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/368,752

(22) Filed: Feb. 8, 2012

(65) Prior Publication Data

US 2012/0134229 A1 May 31, 2012

Related U.S. Application Data

(63) Continuation of application No. 11/767,639, filed on Jun. 25, 2007, now Pat. No. 8,120,989.

(51) Int. Cl.
*G11C 7/10* (2006.01)

(52) U.S. Cl.
USPC ......... 365/238.5; 365/186; 365/187; 365/188

(58) Field of Classification Search
USPC ............................ 365/238.5, 186, 187, 188
See application file for complete search history.

(56) References Cited

U.S. PATENT DOCUMENTS

| | | | |
|---|---|---|---|
| 4,616,347 A | 10/1986 | Bernstein | |
| 4,745,582 A | 5/1988 | Fukushi et al. | |
| 4,845,668 A | 7/1989 | Sano et al. | |
| 5,099,452 A | 3/1992 | Yamakoshi et al. | |
| 5,121,354 A * | 6/1992 | Mandalia | 365/189.02 |
| 5,245,583 A * | 9/1993 | Li et al. | 365/230.06 |
| 5,365,480 A | 11/1994 | Yamamura et al. | |
| 5,692,147 A | 11/1997 | Larsen et al. | |
| 5,717,638 A | 2/1998 | Kim | |
| 5,768,196 A * | 6/1998 | Bloker et al. | 365/200 |
| 5,812,469 A | 9/1998 | Nadeau-Dostie et al. | |
| 5,940,332 A | 8/1999 | Artieri | |
| 5,966,316 A * | 10/1999 | Tsukikawa | 365/51 |
| 5,968,190 A * | 10/1999 | Knaack | 714/719 |
| 6,005,793 A * | 12/1999 | Tran | 365/154 |

(Continued)

FOREIGN PATENT DOCUMENTS

CN 1783341 A 6/2006
EP 1030454 A2 8/2000

(Continued)

OTHER PUBLICATIONS

International Search Report, PCT/US08/068388, International Search Authority, European Patent Office, Oct. 27, 2008.

(Continued)

*Primary Examiner* — Pho M Luu
(74) *Attorney, Agent, or Firm* — Sam Talpalatsky; Nicholas J. Pauley; Joseph Agusta

(57) ABSTRACT

An N-dimension addressable memory is disclosed. The memory includes an N-dimension array of bit cells and logic configured to address each bit cell using N-Dimension Addressing (NDA), where N is at least two and the array of bit cells is addressable by N orthogonal address spaces. Each bit cell of the N-dimension addressable memory includes a bit storage element, N word lines, and N bit lines.

14 Claims, 6 Drawing Sheets

(56) References Cited

U.S. PATENT DOCUMENTS

| | | |
|---|---|---|
| 6,091,626 A | 7/2000 | Madan |
| 6,198,681 B1 | 3/2001 | Forbes |
| 6,385,122 B1 | 5/2002 | Chang |
| 6,418,044 B1 | 7/2002 | Laurent |
| 6,430,666 B1 * | 8/2002 | Roth .................. 711/202 |
| 6,523,145 B1 * | 2/2003 | Ngo et al. ............ 714/733 |
| 6,629,190 B2 * | 9/2003 | Mattison ............. 711/101 |
| 6,678,198 B2 | 1/2004 | Issa et al. |
| 6,931,580 B1 * | 8/2005 | Barcomb et al. ...... 714/742 |
| 6,941,443 B2 | 9/2005 | Isomura et al. |
| 6,980,462 B1 * | 12/2005 | Ramesh et al. ....... 365/154 |
| 7,126,837 B1 * | 10/2006 | Banachowicz et al. ..... 365/63 |
| 7,403,426 B2 | 7/2008 | Hamzaoglu et al. |
| 7,471,544 B2 | 12/2008 | Nakazato et al. |
| 7,483,332 B2 | 1/2009 | Houston |
| 7,495,943 B2 * | 2/2009 | Takemura et al. ...... 365/51 |
| 7,552,413 B2 * | 6/2009 | Agarwal et al. ....... 716/106 |
| 8,046,660 B2 * | 10/2011 | Wu et al. ............. 714/755 |
| 8,120,989 B2 * | 2/2012 | Chen et al. ........... 365/238.5 |
| 2006/0092740 A1 | 5/2006 | Nii |
| 2008/0068909 A1 | 3/2008 | Kajigaya |

FOREIGN PATENT DOCUMENTS

| | | |
|---|---|---|
| EP | 1030455 A2 | 8/2000 |
| JP | 59231792 A | 12/1984 |
| JP | 8171799 A | 7/1996 |
| JP | 2004234809 A | 8/2004 |
| JP | 2006127669 A | 5/2006 |
| JP | 2007305227 A | 11/2007 |
| JP | 2008077738 A | 4/2008 |

OTHER PUBLICATIONS

Written Opinion, PCT/US08/068338, International Search Authority, European Patent Office, Oct. 27, 2008.
European Search Report—EP12168085—Search Authority—Munich—Oct. 5, 2012.

* cited by examiner

CONCURRENT MULTIPLE-DIMENSION WORD-ADDRESSABLE MEMORY ARCHITECTURE

CLAIM OF PRIORITY UNDER 35 U.S.C. §120

The present Application for Patent is a continuation of patent application Ser. No. 11/767,639, now U.S. Pat. No. 8,120,989 entitled "CONCURRENT MULTIPLE-DIMENSION WORD-ADDRESSABLE MEMORY ARCHITECTURE" filed 25 Jun. 2007, issued on 21 Feb. 2012, and assigned to the assignee hereof and hereby expressly incorporated by reference herein in its entirety.

FIELD OF DISCLOSURE

Embodiments of the invention are related to memory architecture. More particularly embodiments of the invention are related to memory architecture optimized, for random matrix process capability.

BACKGROUND

Random access memory (RAM) is a ubiquitous component of modern digital architectures. RAM can be stand alone devices or can be integrated or embedded within devices that use the RAM, such as microprocessors, microcontrollers, application specific integrated circuits (ASICs), system-on-chip (SoC), and other like devices as will be appreciated by those skilled in the art.

Conventional integrated circuit memory architectures such as single ported memory, dual-ported memory and Content Addressable Memory (CAM), provide only one dimension of data word addressing space/organization. For example, a simple memory containing four words addressable linearly (i.e., one dimension only) either 0, 1, 2 or 3 is illustrated in FIG. 1A. The memory access via conventional integrated circuit memory architectures is limited to either read or write the selected (addressed) 4-bit word 110, as illustrated. If an application requires that bit 2 of the word 0, 1, 2 and 3 are read/written (e.g., 120 in FIG. 1B), four memory access cycles will be required. For example, in conventional single potted memory, all 4 words can be read/written but each bit will still be in the respective row it is read/written. Additional operations (e.g., shifting, masking, etc.) will be required, to manipulate the bits to obtain the individual bit information, as will be appreciated by those skilled in the art.

Many high performance applications such as signal processing, audio and video encoding/decoding, and the like use data stored in bit patterns that are not limited to the conventional word arrangements. Accordingly, it would be beneficial to have a memory architecture optimized for random matrix operations.

SUMMARY

Exemplary embodiments of the invention are directed to memory architecture optimized for random matrix operations.

Accordingly an embodiment of the invention can include an N-dimension addressable memory comprising: an N-dimension array of bit cells; and logic configured to address each bit cell using N-Dimension Addressing, wherein N is at least two and wherein the array of bit cells is addressable by N orthogonal address spaces.

Another embodiment of the invention can include a bit cell of an N orthogonal dimension addressable memory comprising: a bit storage element; N word lines; and N bit lines, wherein N is at least two.

Another embodiment of the invention can include a method of accessing memory comprising: establishing a first set of addressable words from an N-dimension array of bit cells; and establishing a second set of addressable words from the N-dimension array of bit cells, wherein N is at least two and the first and the second set address spaces are orthogonal.

BRIEF DESCRIPTION OF THE DRAWINGS

The accompanying drawings are presented, to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 2:
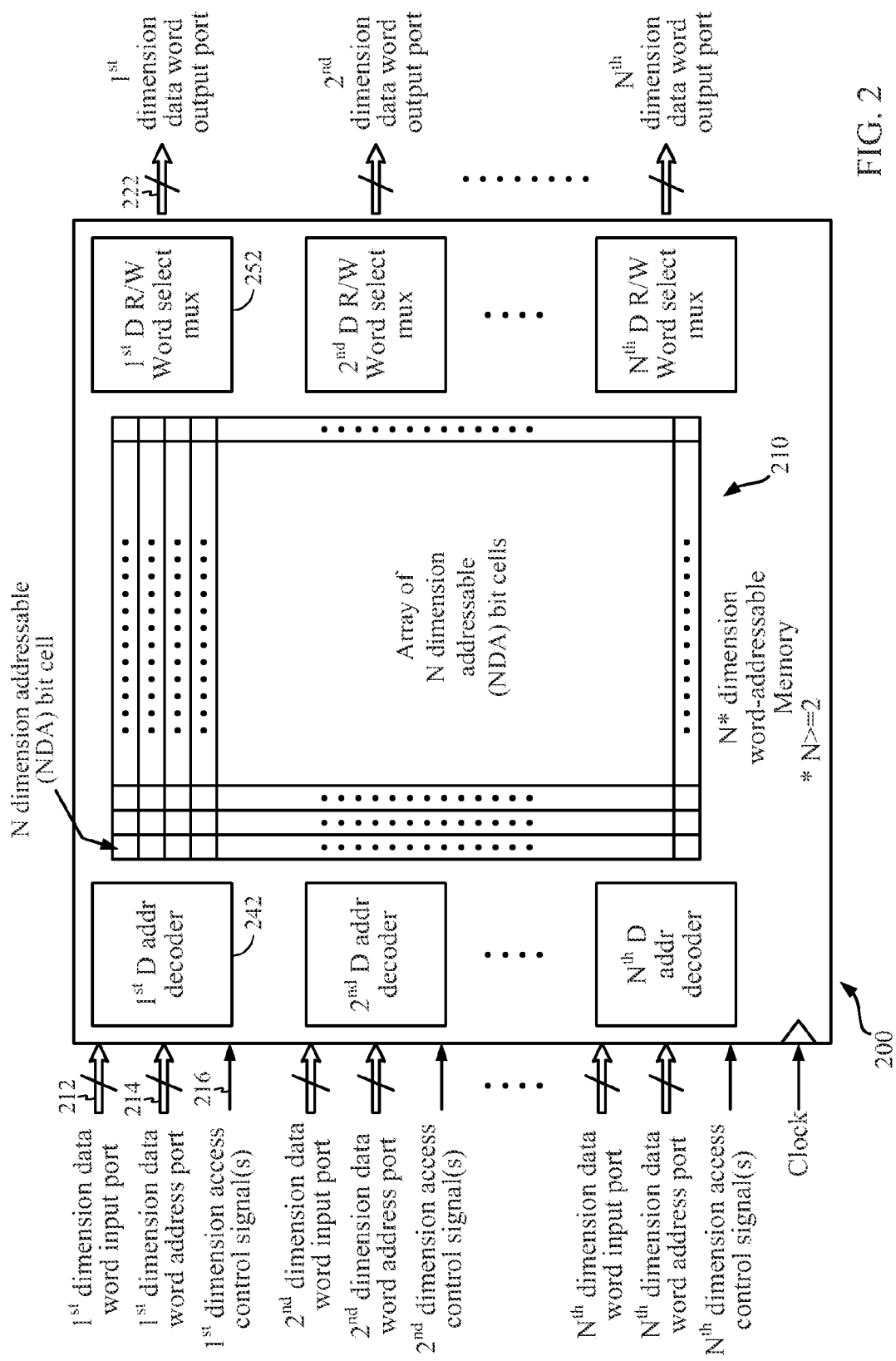
FIG. 2 is a block diagram of a memory architecture for a generalized N-Dimension word-addressable memory.

FIG. 2 illustrates a block diagram of a generalized N orthogonal dimension word-addressable memory 200 according to at least one embodiment of the invention. N, as used herein, is an integer larger than or equal to 2. An N orthogonal dimension word-addressable memory contains an array of memory bit cells each of which can be addressable by N orthogonal addressing spaces or an N-Dimension Addressing (NDA) scheme. Each of the N dimensions has a data word input port (e.g., 212), a data word address port (e.g., 214), and an access control line (e.g., 216). Each of the N dimensions also has a corresponding data word output port (e.g., 222). In alternative embodiments, the functionality of input port 212 and output port 222 can be combined in a common input/output port that can be used for both data input and data output.

Accordingly, an embodiment of the invention can include an N-dimension addressable memory 200 having an N-dimension array of bit cells 210 and logic configured (e.g., decoders 1-N) to address each bit cell using N-Dimension Addressing (NDA), where N is at least two. The array of bit cells 210 is addressable by N orthogonal addressing spaces, as discussed above. The logic configured to address each bit cell can comprise N address decoders (e.g., 242). Each address decoder can be configured to receive a data word address 214, and a dimension access control signal 216. Additionally, word select multiplexer (mux) (e.g., 252) can be included for each N-dimension, which can work in cooperation with a corresponding address decoder (e.g., 242) to achieve the random matrix addressing for random matrix read/write operations. Additionally, the memory can include logic configured to read/write data for each N-dimension such as sense amplifiers, line drivers and the like that may also be included depending on the specific memory type.

Figure 3:
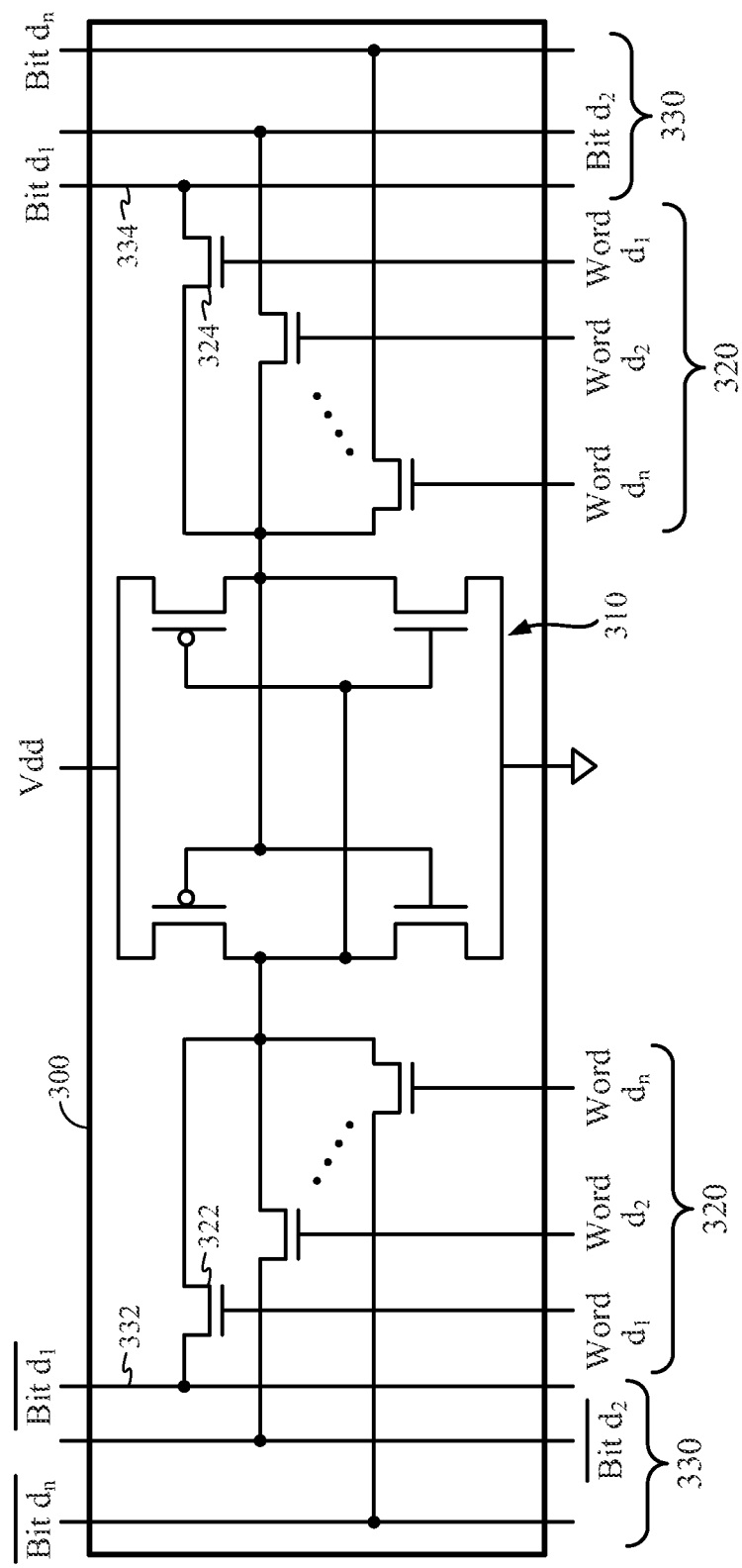
FIG. 3 is a circuit diagram of an N-Dimension Addressing (NDA) Static Random Access Memory (SRAM) based bit cell.

FIG. 3 illustrates an NDA SRAM-based bit cell implementation according to at least one embodiment of the invention. The NDA SRAM bit cell illustrated in FIG. 3 can be arranged similar to a conventional SRAM bit cell to form a compact N-Dimension Word Addressable (N-DWA) SRAM. For example, a 2-dimensional array in an exemplary embodiment of the invention can occupy the equivalent area of a conventional 2-port static random access memory (SRAM). However, embodiments of the invention are not limited to any particular arrangement.

Accordingly, an embodiment of the invention can include a bit cell 300 of an N orthogonal dimension addressable memory. The bit cell can include a bit storage element 310, N word lines 320, and N bit lines 330, where N is at least two. The bit cell can be part of a static random access memory (SRAM), as discussed, above. However, embodiments of the invention are not limited to any particular memory type. As illustrated, each of the bit lines can include a first line (e.g., 334) coupled to the storage element 310 and a second, line (e.g., 332) coupled to the storage element, wherein a bit value is determined by a differential voltage between the first 334 and second 332 lines when word d1 is selected, as is well known in the art. Likewise, each of the N word lines 320 are coupled to a device (e.g., transistors 322 and 324) configured to couple a corresponding bit line (332 and 334) from the N bit lines to the storage element 310, if the word, line is activated. Those skilled in the art will appreciate that by activating the associated word lines, any of the N bit lines can be selected and the value of the storage element can be read, or written using that bit line. Since the bitcell operational details are not needed for an understanding of embodiments of the invention and are well known in the art, a detailed discussion will not be provided herein.

The N-Dimension Word Addressable (N-DWA) memory can have N concurrent memory access channels each of which comprises a data word input port Din(i), a data word address port Addr(i), a data word output port Dout(i), and a control port Ctrl(i), where i designates one of the N orthogonal addressing space. The bitwidth of either Din(i) or Dout(i) defines the number of bits per word, i.e., the number of target NDA bit cells addressed (selected) each time by the word address Addr(i), Ctrl(i) provides one or more control signals for selecting one of the supported access operations such as a word, read operation or a word write operation. Embodiments of the invention do not restrict or impose an explicit N-Dimension Addressing (NDA) scheme. For example, embodiments of the invention can include an N-DWA memory structure that is configured for the target matrix-oriented application as following in Table 1.

TABLE 1

Matrix Characteristics and N-DWA memory parameters

| Matrix characteristics | N-DWA memory parameters |
|---|---|
| # of dimensions | N |
| # elements per vector per dimension | Din(i) or Dout(i) bitwidth |
| # of matrixes to be stored at one time | Addr(i) bitwidth = $\log_2$(total stored elements/Bitwidth(Din(i))) |

For example, if the target matrix is 2×4 and there are a total of 4 matrixes to be stored, at once, a 2-DWA memory can be used as described in the following in Table 2.

TABLE 2

2-Dimension Word Addressable (DWA) memory
2-DWA memory parameters
N = 2

Figure 4A:
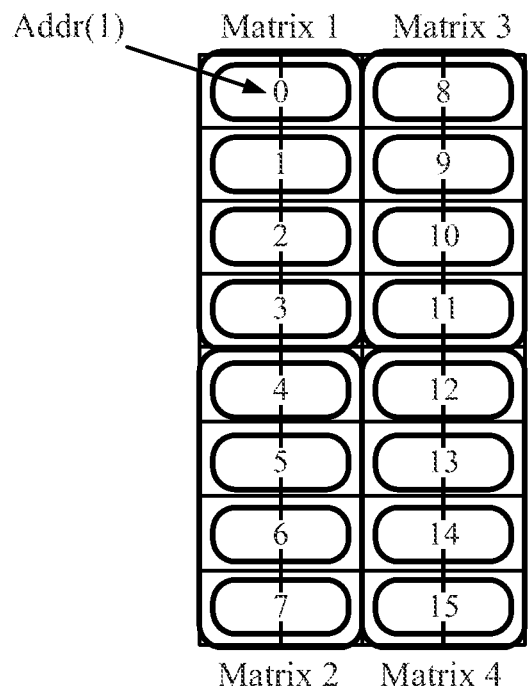
FIGS. 4A and 4B illustrate addressing a 2-Dimension Word Addressable (DWA) memory.
Figure 4B:
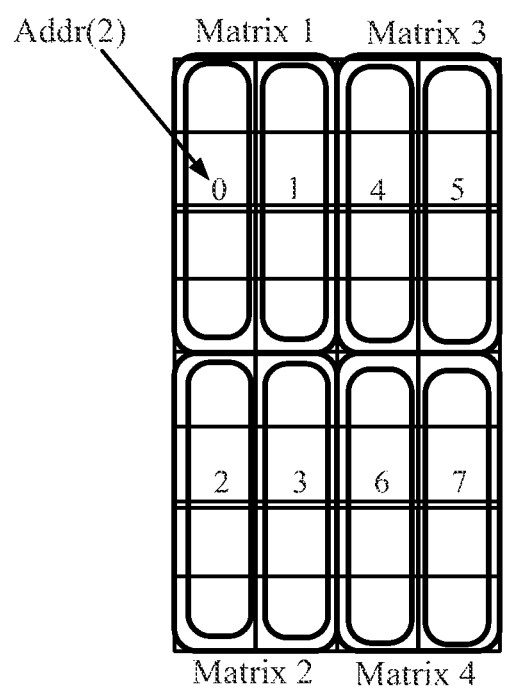

Bitwidth of Din(1) and Dout(1) = 2 bits
Bitwidth of Din(2) and Dout(2) = 4 bits
Bitwidth of Addr(1) = $\log_2(2 \times 4 \times 4/2)$ = 4 bits
Bitwidth of Addr(2) = $\log_2(2 \times 4 \times 4/2)$ = 3 bits FIGS. 4A and 4B illustrate an addressing scheme for a 2-Dimension Word Addressable (DWA) memory in accordance with at least one embodiment of the invention. In FIG. 4A, Address (1) (Addr (1)) is used to address sixteen 2-bit words. Each of the 2-bit words (e.g., 0-15) represents a 2-element row of a target matrix data. In FIG. 4B, Address (2) (Addr (2)) is used to address eight 4-bit words (e.g., 0-7). Each of the 4-bit words represents a 4-element column of a target matrix data. Each of these examples will be discussed in greater detail below.

Referring to FIG. 4A, a configuration of a 2-Dimension Word Addressable (DWA) memory is illustrated for Addr (1). The memory can be addressed by Addr (1) which comprises sixteen 2-bit words each of which represents a 2-element row of target matrix data as illustrated. When accessed by Addr (1), memory matrix 1, includes words 0-3; matrix 2, includes words 4-7; matrix 3, includes words 8-11; and matrix 4 includes words 12-15. Accordingly, if two bits in the second row of matrix 4 are to be read/written, Addr (1) can be set to the value 13 and a single read/write operation can be performed and a 2-bit word can be outputted/stored.

Referring to FIG. 4B, a configuration of a 2-Dimension Word Addressable (DWA) memory is illustrated, for Addr (2). The memory can be addressed by Addr (2) which comprises eight 4-bit words (0-7) each of which represents a 4-element column of target matrix data. When accessed by Addr (2), memory matrix 1, includes words 0-1; matrix 2, includes words 2-3; matrix 3, includes words 4-5; and matrix 4 includes words 7-8. Accordingly, if four bits in the second column of matrix 1 are to be read/write, Addr (2) can be set to the value 1 and a single read/write operation can be performed. For exampled for a read operation, a 4-bit output of the column data in matrix 1, column 1 can then be obtained, in a single operation. Likewise, for a write operation, 4-bit data can be stored to matrix 1, column 1 in a single operation.

Figure 1A:
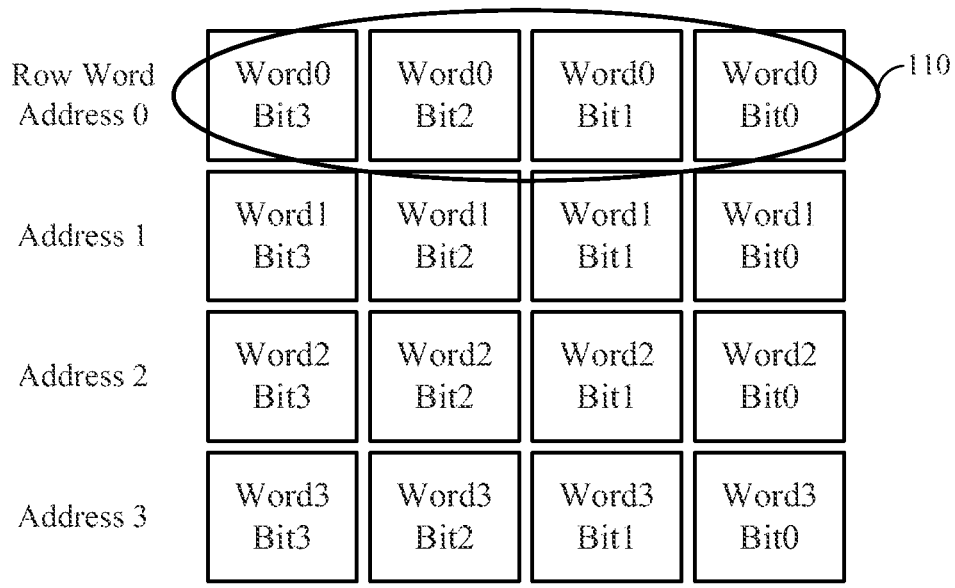
FIG. 1A is a block diagram of an array of memory which illustrates a conventional addressing operation.
Figure 1B:
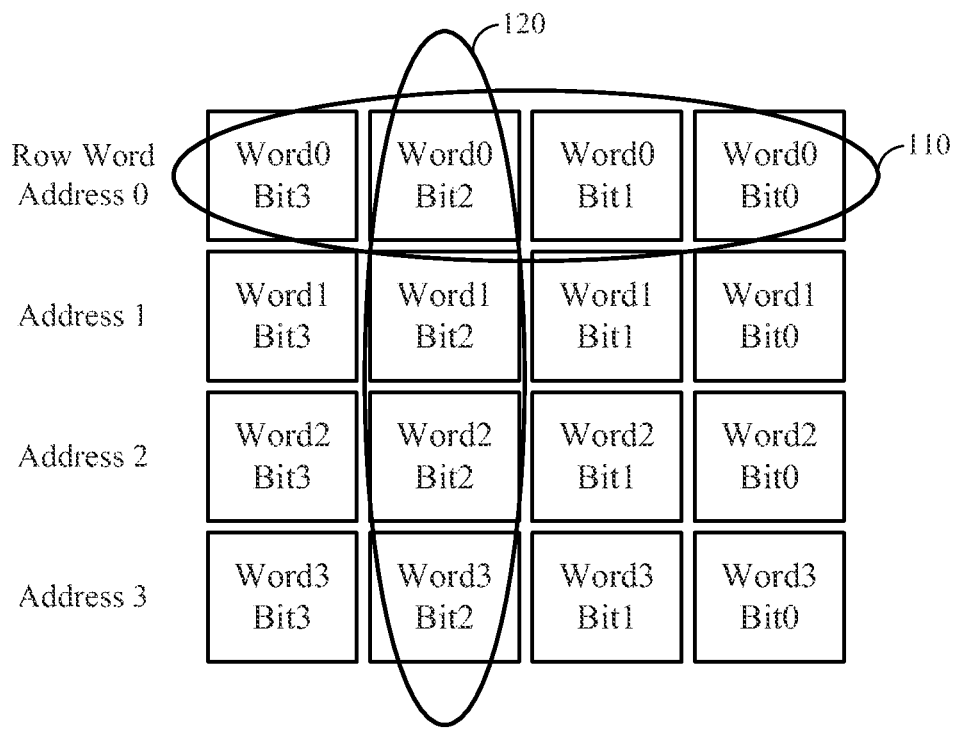
FIG. 1B is a block diagram of an array of memory which illustrates desired bits to be read.

As discussed in relation to FIGS. 1A and 1B if an application requires the reading of bit 2 of the words 0, 1, 2 and 3 as indicated by reference 120, in FIG. 1B using a conventional single ported memory, it will require four memory access cycles to read all four words. Then, additional operations will be needed to extract the bit 2 information individually. In contrast an exemplary embodiment of the invention allows for the data to be accessed in a single memory cycle.

Figure 5:
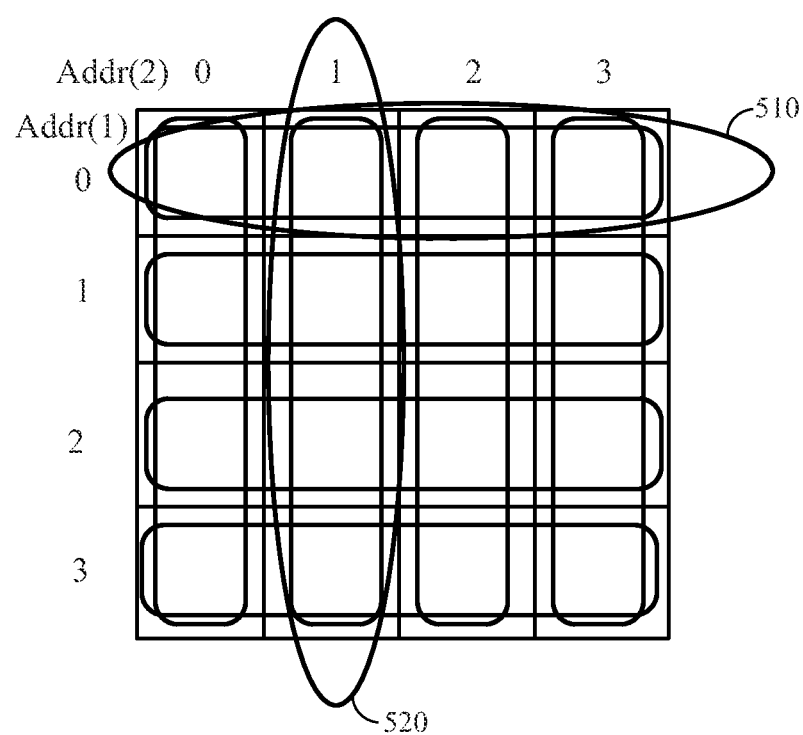
FIG. 5 illustrates a 4×4 2-Dimension Word Addressable (DWA) memory.

For example, a 2-Dimension Word Addressable memory configured as indicated in Table 3 and illustrated in FIG. 5 can be created to offer concurrent and single-cycle 4-bit row and column word accesses of the target 4×4 matrix data. The matrix is similar to the one illustrated in FIGS. 1A and 1B.

TABLE 3

| 4 × 4 2-Dimension Word Addressable (DWA) memory 2-DWA memory parameters N = 2 |
|---|
| Bitwidth of Din(1) and Dout(1) = 4 bits |
| Bitwidth of Din(2) and Dout(2) = 4 bits |
| Bitwidth of Addr(1) = $\log_2(4 \times 4 \times 1/4)$ = 2 bits |
| Bitwidth of Addr(2) = $\log_2(4 \times 4 \times 1/4)$ = 2 bits |

Using a 4×4 2-Dimension Word Addressable (DWA) memory as illustrated in FIG. 5, a one column word read/write, 520, can be performed (e.g., Addr(2)=1). Accordingly, the column of data can be read/written in only one memory access cycle. Further, it can be appreciated from the foregoing that embodiments of the invention can also address data 510 and read/write the data, which corresponds to a conventional read/write operation (e.g., 110 in FIG. 1A).

The foregoing description has provided several examples and advantages of embodiments of the invention. Those skilled in the art will appreciate from the foregoing description that embodiments of the invention are well suited, to matrix intensive applications. One exemplary application of at least one embodiment of the invention is digital communications. For example, an N-DWA memory can be used for block interleaving and de-interleaving which are typical tasks performed in digital communication systems, such as Code Division Multiple Access (CDMA), CDMA2000, and WCDMA systems. For example, a block interleaver can accept the coded symbols in blocks by filling the columns of an M-row-by-N-column (M×N) array. Then, the interleaved symbols can be fed to a modulator one row at a time. The block de-interleaver on the other hand performs the inverse operation. Block interleaving and de-interleaving are well known in the art, so further details will not be provided herein (see, e.g., Bernard Sklar, Digital Communications Fundamentals and Applications, second edition, page 464).

The process of block interleaving and de-interleaving can require many memory and logic operations using conventional systems. However, an embodiment of the invention permits direct matrix operation without the need for additional logic operations. For example, referring to Table 4, an M×N 2-Dimension Word Addressable memory can be created to offer concurrent and single-cycle M row and N column word accesses of the matrix data.

TABLE 4

| M × N × 2 2-Dimension Word Addressable (DWA) memory | |
|---|---|
| 2-DWA M × N memory parameters N = 2 | 2-DWA M × N × 2 memory parameters N = 2 |
| Bitwidth of Din(1) and Dout(1) = $\log_2(M)$ bits | Bitwidth of Din(1) and Dout(1) = $\log_2(M)$ bits |
| Bitwidth of Din(2) and Dout(2) = $\log_2(N)$ bits | Bitwidth of Din(2) and Dout(2) = $\log_2(N)$ bits |
| Bitwidth of Addr(1) = $\log_2(N \times 1)$ bits | Bitwidth of Addr(1) = $\log_2(N \times 2)$ bits |
| Bitwidth of Addr(2) = $\log_2(M \times 1)$ bits | Bitwidth of Addr(2) = $\log_2(M \times 2)$ bits |

Figure 6:
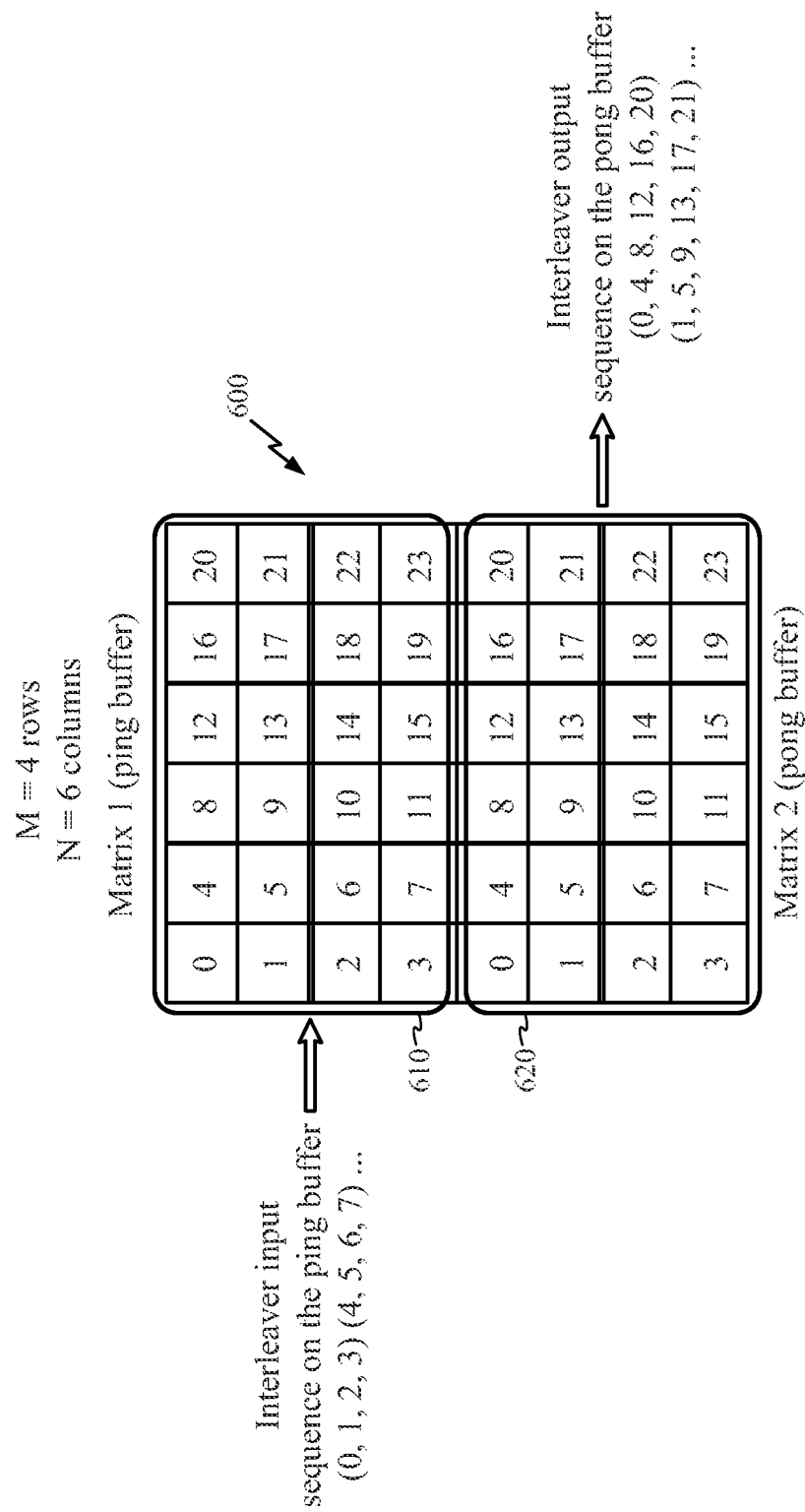
FIG. 6 illustrates a 2-Dimension Word Addressable (DWA) M×N×2 memory in an M×N matrix ping-pong buffer configuration.

Referring back to the block interleaving and/or de-interleaving example, one 2-DWA memory configured, for an M×N (e.g., 4×6) matrix operation can be used to implement a block interleaving or de-interleaving hardware design without extra logic. Alternatively, using one 2-DWA memory with storage for 2 M×N matrixes, as shown in the right column of Table 4 and as illustrated in FIG. 6, can be used to form a ping-pong buffer 600. The 2-DWA M×N×2 memory can function as an M×N matrix ping-pong buffer configuration 600 for block interleaving or de-interleaving to achieve high-performance one symbol per memory cycle throughput. An example of this configuration is illustrated in FIG. 6. For example, the interleaver input sequence can directly fill the ping buffer 610 in a column by column manner with an input sequence (e.g., (0, 1, 2, 3) (4, 5, 6, 7) . . . ). The interleaved output sequence (e.g., (0, 4, 8, 12, 16, 20) (1, 5, 9, 13, 17, 21) . . . ) can be directly retrieved on a row by row basis from the pong buffer 620. Accordingly, an interleaved output sequence can be generated without any additional logic. The interleaving can also be determined based on the configuration of the memory array (e.g., M×N).

The de-interleaving operation can be achieved by a similar configuration which is the reciprocal of the interleaving operation. For example, the interleaved output sequence (e.g., (0, 4, 8, 12, 16, 20) (1, 5, 9, 13, 17, 21) . . . ) can be filled row by row into the receiving memory. The interleaved, output sequence can be directly de-interleaved by reading the data out column by column (e.g., (0, 1, 2, 3) (4, 5, 6, 7) . . . ) to recover the original input sequence. Accordingly, the de-interleaving function can also be achieved, directly from the memory without any additional logic.

Although the prior example emphasized the ability of embodiments of the invention to perform matrix functions in digital communications systems, embodiments of the invention are not limited to those applications. For example, in video encoding/decoding, objects may be defined as an array in memory and motion may be simulated by moving the object a certain number of columns or rows in the array. Embodiments of the invention allow for flexible addressing of memory arrays so that object movement and processing can be improved. Accordingly, embodiments of the invention are not limited to the examples and illustrations contained herein.

Further, it will be appreciated from the foregoing that embodiments of the invention can include methods for performing the sequence of actions, algorithms, functions and/or steps discussed herein. For example, an embodiment can include a method of accessing memory comprising establishing a first set of addressable words from an N-dimension array of bit cells and establishing a second set of addressable words from the N-dimension array of bit cells. As discussed above, N is at least two and the first set of addressable words and the second set of addressable words are orthogonal. The method can further include determining a bitwidth(i) for each set of addressable words as a number of elements per vector per dimension (e.g., 2 and 4 for FIGS. 4A and 4B, respectively). The address bitwidth(i) can be determined as: Addr(i) bitwidth=$\log_2$(total stored elements/bitwidth(i)). For example, the corresponding address bitwidth was determined as $\log_2(32/2)=4$ and $\log_2(32/4)=3$ for FIGS. 4A and 4B, respectively. In this example, the first set of addressable words has a different bitwidth than the second set of addressable words. However, the first set of addressable words may also have the same bitwidth as the second set of addressable words (see, e.g. FIG. 5) while still being orthogonal. Embodiments can further include writing an input sequence to the first set of addressable words and reading an output sequence from the second, set of addressable words, which can result in an interleaved output. Still further, the input sequence can be written to a first buffer (e.g., a ping buffer) and output sequence can be read out of a second buffer (e.g., a pong buffer).

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described, herein need not be performed in any particular order. Furthermore, although elements of the invention may be described or claimed in the singular, the plural is contemplated unless limitation to the singular is explicitly stated.

What is claimed is:

1. An N-dimension addressable memory comprising:
an N-dimension array of bit cells; and
logic configured to address each bit cell using N-Dimension Addressing, wherein N is at least two and wherein the array of bit cells is addressable by N orthogonal address spaces, wherein each bit cell comprises:
a bit storage element;
N word lines; and
N bit lines, wherein each of the N word lines are coupled to a device configured to couple a corresponding bit line from the N bit lines to the storage element, if a corresponding word line of the N word lines is activated.

2. The memory of claim 1, wherein the logic configured to address each bit cell further comprises:
N address decoders; and
N word select multiplexers.

3. The memory of claim 2, wherein each address decoder is configured to receive a data word address, and an access control signal.

4. The memory of claim 1, further comprising:
logic configured to input data for each N-dimension; and
logic configured to output data for each N-dimension.

5. The memory of claim 4, wherein the logic configured to input data for each N-dimension includes a data word input port.

6. The memory of claim 4, wherein the logic configured to output data for each N-dimension includes a sense amplifier.

7. A bit cell of an N orthogonal dimension addressable memory comprising:
a bit storage element;
N word lines; and
N bit lines, wherein N is at least two, and wherein each of the N word lines are coupled to a device configured to couple a corresponding bit line from the N bit lines to the storage element, if a corresponding word line is activated.

8. The bit cell of claim 7, wherein the bit cell is part of a static random access memory (SRAM) or dynamic random access memory (DRAM).

9. The bit cell of claim 7, wherein each of the N bit lines comprise:
a first line coupled to the storage element; and
a second line coupled to the storage element, wherein a bit value is determined by a difference between the first and second lines.

10. The bit cell of claim 9, wherein each of the N word lines comprise:
a first line coupled to a first device configured to couple the first line of the bit line to the storage element; and
a second line coupled to a second device configured to couple the second line of the bit lines to the storage element.

11. A method of accessing an N-dimension addressable memory comprising an N-dimension array of bit cells, the method comprising:
addressing each bit cell using N-Dimension Addressing, wherein N is at least two and wherein the array of bit cells is addressable by N orthogonal address spaces, wherein each bit cell comprises a bit storage element, N word lines, and N bit lines; and
coupling each of the N word lines to a device, and coupling the device to a corresponding bit line from the N bit lines to the storage element, if a corresponding word line from the N word lines is activated.

12. A method of accessing a bit cell of an N orthogonal dimension addressable memory, the method comprising:
accessing the bit cell using N word lines and N bit lines, wherein N is at least two,
wherein each of the N word lines are coupled to a device configured to couple a corresponding bit line from the N bit lines to a storage element of a bit cell, if a corresponding word line of the N word lines is activated.

13. A system comprising:
an N-dimension addressable memory comprising an N-dimension array of bit cells; and
means for addressing each bit cell using N-Dimension Addressing, wherein N is at least two and wherein the array of bit cells is addressable by N orthogonal address spaces, wherein each bit cell comprises:
a bit storage element;
N word lines; and
N bit lines, wherein each of the N word lines are coupled to a means for coupling a corresponding bit line from the N bit lines to the storage element, if a corresponding word line from the N word lines is activated.

14. A bit cell of an N orthogonal dimension addressable memory comprising:
- a bit storage element;
- N word lines; and
- N bit lines,
- wherein each of the N bit lines comprise:
  - a first line coupled to the storage element; and
  - a second line coupled to the storage element, wherein a bit value is determined by a difference between the first and second lines; and
- wherein each of the N word lines comprise:
  - a first line coupled to a first device configured to couple the first line of the bit line to the storage element; and
  - a second line coupled to a second device configured to couple the second line of the bit lines to the storage element.

* * * * *